United States Patent [19]
Grimmer

[11] Patent Number: 5,385,848
[45] Date of Patent: Jan. 31, 1995

[54] METHOD FOR FABRICATING AN INTERCONNECTED ARRAY OF SEMICONDUCTOR DEVICES

[75] Inventor: Derrick P. Grimmer, Fremont, Mo.

[73] Assignee: Iowa Thin Film Technologies, Inc, Ames, Iowa

[21] Appl. No.: 123,169

[22] Filed: Sep. 20, 1993

[51] Int. Cl.⁶ .............................. H01L 31/18
[52] U.S. Cl. .............................. 437/2; 437/4; 437/181; 136/244
[58] Field of Search .............. 437/2, 4, 205, 51; 136/244

[56] References Cited

U.S. PATENT DOCUMENTS

| | | |
|---|---|---|
| 4,603,470 | 8/1986 | Yamazaki . |
| 4,724,011 | 2/1988 | Turner et al. . |
| 4,745,078 | 5/1988 | Stetter et al. . |
| 4,746,618 | 5/1988 | Nath et al. . |
| 4,758,526 | 7/1988 | Thalheimer . |
| 4,873,201 | 10/1989 | Grimmer et al. . |
| 4,965,655 | 10/1990 | Grimmer et al. . |
| 5,273,911 | 12/1993 | Sasaki et al. ................. 437/4 |
| 5,296,043 | 3/1994 | Kawakami et al. ........... 136/244 |

Primary Examiner—Olik Chaudhuri
Assistant Examiner—Brian K. Dutton

[57] ABSTRACT

A method of forming an array of interconnected solar cells. A flexible substrate carrying semiconductor and conductive layers is divided into individual devices by slitting the substrate along the web length. The individual devices are then connected with one another in series by laminating the substrate onto an insulating backing and by depositing conducting interconnection layers which join the lower conductor of one device with the top conductor of the adjoining device.

20 Claims, 8 Drawing Sheets

METHOD FOR FABRICATING AN INTERCONNECTED ARRAY OF SEMICONDUCTOR DEVICES

The Government of the United States of America has rights in this invention pursuant to Subcontract NAS3-26595 awarded by the United States National Aeronautics and Space Administration (NASA).

BACKGROUND OF THE INVENTION

1. Field of Invention

The present invention relates generally to a method for forming an interconnected array of semiconductor devices and, more particularly, to a method of making a serially interconnected array of photovoltaic devices.

2. Discussion of the Background

Solar cells represent a source of electrical energy based on an inexhaustable "fuel", with the operation of such devices being nonpolluting. The primary difficulty in the use of a photovoltaic device based electrical energy source has been economics. The costs of fabricating solar cells have heretofore prevented widespread use of such cells for providing electrical energy, and have confined such use to special situations where the fabrication economics do not make their use prohibitive.

A major improvement in economics follows from the use of thin-film semiconductor material in the solar cells rather than crystalline silicon material. Thin-film semiconductive material may be amorphous or polycrystalline in composition. For example, hydrogenated amorphous silicon (a-Si:H), copper indium diselenide (CIS), and cadmium telluride (CdTe) are examples of suitable thin-film materials having a semiconductor direct band gap.

Crystalline silicon is an indirect-band-gap material meaning that a lattice phonon is required to participate in the absorption process with an incident photon. Thus, crystalline silicon absorbs electromagnetic radiation relatively weakly. Thin-film semiconductors of the types mentioned above, on the other hand, are direct-band-gap materials of an effectively larger band gap in which the incident photon can be absorbed without an interaction being required of lattice phonons. As a result, a direct band gap thin-film semiconductor device of a given thickness can absorb as much electromagnetic radiation from the sun as can a crystalline silicon layer many times its thickness typically in a thickness ratio of fifty to one. Thus, very much thinner films of direct band gap semiconductors can be used and still absorb the same amount of incident radiation energy, a structure which reduces the cost of a solar cell considerably.

A-Si:H, CIS, and CdTe are thin-film semiconductor materials which have a relatively well-defined energy gap and in which the semiconductor properties can be controlled by the doping of further impurities. That is, by doping with small amounts of a suitable element, n-type conductivity material and p-type conductivity material can be provided. This situation permits the forming of p-n junction structures or devices or p-i-n structures ("i" meaning intrinsic or near intrinsic semiconductor material) so that direct band gap semiconductor structures subject to incident electromagnetic radiation can be operated as photovoltaic solar cells.

Such solar cells are usually formed in a large array of individual cells to capture large amounts of incident sunlight. For example, A-Si:H is used to make p-i-n homojunction cells. CIS is used with CdS to make CIS/CdS heterojunction cells; and CdTe is used with CdS to make CdTe/CdS heterojunction cells. However, because p-n junctions or p-i-n layer arrangements formed in doped thin-film direct band gap semiconductors yield photovoltaic cells with open circuit voltages measuring several tenths of a volt, there is a desire to electrically interconnect at least some cells in the array in series to provide a greater output voltage. Typically, such cells are formed as a "sandwich-like" structure on a substrate with such cells having, as a general matter, two conductive layers with a semiconductor material layer therebetween where one of the conductive layers is directly on the substrate. The semiconductor layer has a p-n junction or p-i-n layer arrangement more or less parallel to the conductive layers. One of the conductive layers is transparent to pass incident electromagnetic radiation to the semiconductor material layer (the substrate will also be transparent if it directly supports the transparent conductive layer).

There is difficulty with this arrangement in electrically interconnecting the conductive layer adjacent the substrate in one cell, because of it being covered by the other "sandwich" layers, to the conductive layer of a adjacent cell on the opposite side of the semiconductor material layer therein. The series electrical interconnection of cells is especially difficult when the thin-film cell substrate is a conductor such as a metal sheet or foil. In the case of a conducting substrate, the substrate must be cut or slit to form physically separate or discrete cells, the cells arranged on an insulating backing, and the individual cells reconnected in series on the insulating backing.

U.S. Pat. Nos. 4,873,201 and 4,965,655 are good descriptions of the background of the present invention. In the arrangement described by these earlier patents, a laser beam is used to cut a separating space between different parts of the array. An insulator is placed in the space and a penetrating terminal is placed in each part of the array so as to make contact with the lower conductive layer. The top of the penetrating terminal is interconnected to the top of the adjoining portion to form a series interconnection. However, the methods described in these previous patents do not allow monolithic interconnection of solar cells on an electrically conducting substrate. The present invention allows series interconnection of cells on conducting substrate using a roll-to-roll fabrication process.

U.S. Pat. No. 4,746,618 describes a method to slit a web substrate into strips and bond it to an insulating layer. However, the method involves slitting the web transversely to the web length, and necessitates leaving unslit a portion of web near its edge in order to maintain structural integrity using the non-slitted connector. The present invention involves continuous slitting down the length of the web and does not require leaving unslit portions of the web between module segments. Spreader rollers are used instead to control down-web separation of the strips cut lengthwise, not transversely, from a continuously moving web. U.S. Pat. No. 4,746,618 requires step-and-repeat transverse slitting operations.

SUMMARY OF THE INVENTION

Accordingly, one object of the present invention is to provide a novel method of fabricating an interconnected array of semiconductor devices.

Another object of this invention is to provide a novel method for economically producing a series interconnection in an array of photovoltaic devices.

Another object of this invention is to provide a novel method for interconnecting in series an array of semiconductor devices by slitting a flexible substrate web, which may be electrically conducting, along its length, and then interconnecting the resultant portions of strips parallel to the length of the web.

A still further object of this invention is to provide a novel method for interconnecting an array of photovoltaic devices in series by using a slitter and laminating rollers.

Briefly these and other objects of the invention are achieved by slitting a substrate which carries a semiconductor layer between conductive layers so as to form individual semiconductor devices in an array. After slitting, the separate strips parallel to the web length are separated by a curved spreader roller to create a gap between strips. The strips are laminated to an insulating sheet using an adhesive coating and laminating rollers. A conductive layer placed between insulating layers is inserted between sections in contact with the lower conductive layer of one section. This is then connected to the top conductive layer of the adjoining section to form a series interconnection.

DETAILED DESCRIPTION OF THE PREFERRED EMBODIMENTS

Figure 1A:
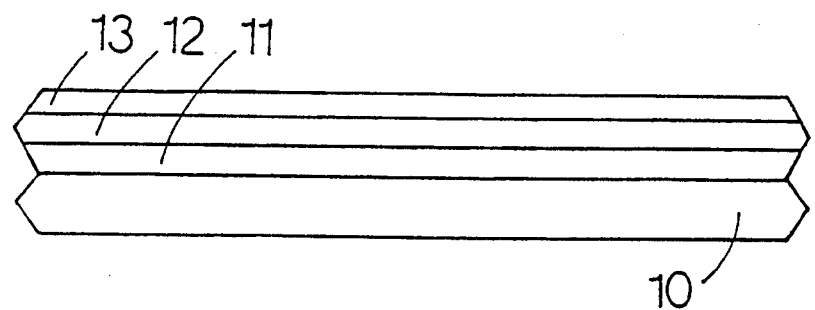
FIGS. 1A through 1G show results of steps in the process of fabricating a device according to the present invention.

Referring now to the drawings wherein like reference numerals designate identical or corresponding parts throughout several views and more particularly FIG. 1A thereof which shows a portion of a metal foil, 10, which is a substrate on which solar cell semiconductor devices are to be formed. The thickness of the metal foil substrate, 10, is 0.5 mil or 1.0 mil, and can be stainless steel or nickel foil. Formed on substrate 10 is a layer, 11, of metal or metal alloy suitable for making good ohmic contact to the semiconductor layers of the solar cell, 12. Depending on the band gap of the semiconductor layers, 12, aluminum, molybdenum, nickel, titanium or other metal with suitable work function and optical reflectivity top surface may be used. Typical thicknesses of metal ohmic contact layer, 11, range from 0.4 micrometers to 2 micrometers, depending on the metal and its texture used. Layer 11 supports a semiconductor material layer, 12, at its lower major surface. Layer 11 may be composed of a-Si p-i-n single or multijunction structure; p-n copper indium diselenide/cadmium sulfide heterojunctions (CIS/CdS) and related alloys; p-n cadmium telluride/cadmium sulphide (CdTe/CdS); or other doped semiconductor device materials that can be deposited in thin layers on a metal foil substrate 10. Typical thickness of semiconductor layers, 12, range from 0.5 micrometers to 2.0 micrometers. Thereafter, a layer of metal oxide, 13, is deposited on the upper device surface as a transparent, conducting ohmic contact to the solar cell device. Tin oxide, indium oxide, indium tin oxide and zinc oxide (ZnO) have been used as transparent contacts in solar cells. ZnO deposited 1.0 micrometers thick is such a suitable oxide for layer 13. The resulting layer 13 has a sheet resistance of approximately 10 ohms/square and an optical transmission of 90%. Layer 13 is transparent to portions of the spectrum of sunlight which are significantly absorbed by semiconductor material layer 12, so that electromagnetic radiation from the sun coming from above in FIG. 1A will reach semiconductor layer 12.

No representation of the p-n junction or p-i-n (single or multiple) junction present in the figures of this application is provided, as it would unnecessarily complicate them. Further, these figures are not to actual scale, and proportions have been chosen for clarity rather than actual physical representation.

Figure 1B:
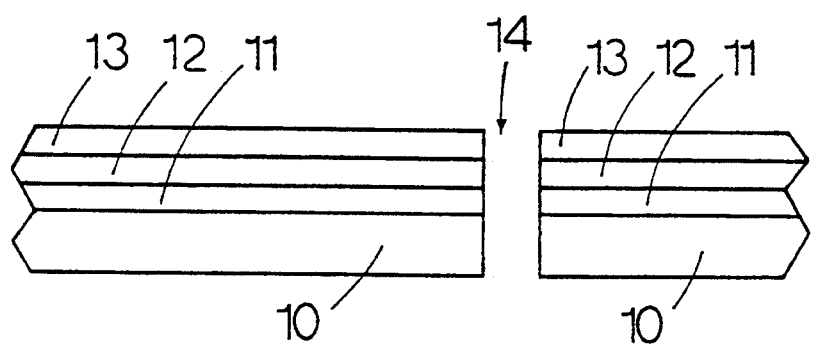

FIG. 1B shows the result of dividing metal foil 10, bottom ohmic contact layer 11, semiconductor device 12, and transparent conducting top contact 13, into a plurality of strips parallel to the web length, each of which will form a solar cell semiconductor device. The use of a web slitter with spreader rollers provides a satisfactory method for leaving a separating space, 14, between each of the foil strip portions of approximately 10 mil in width. The dividing may be continuous or may be interrupted in web regions that are between module segments.

The layered structure shown in FIG. 1B is formed as an elongated arrangement to the right and left of what is shown so that a plurality of separating spaces 14 to the right and left of the one shown and perpendicular to the plane of the paper are also formed. These spaces lead to the plurality of solar cell semiconductor devices being formed. The elongated arrangement can be stored in rolls before or after subsequent process steps to make convenient the handling of large numbers of joined semiconductor devices.

Figure 1C:
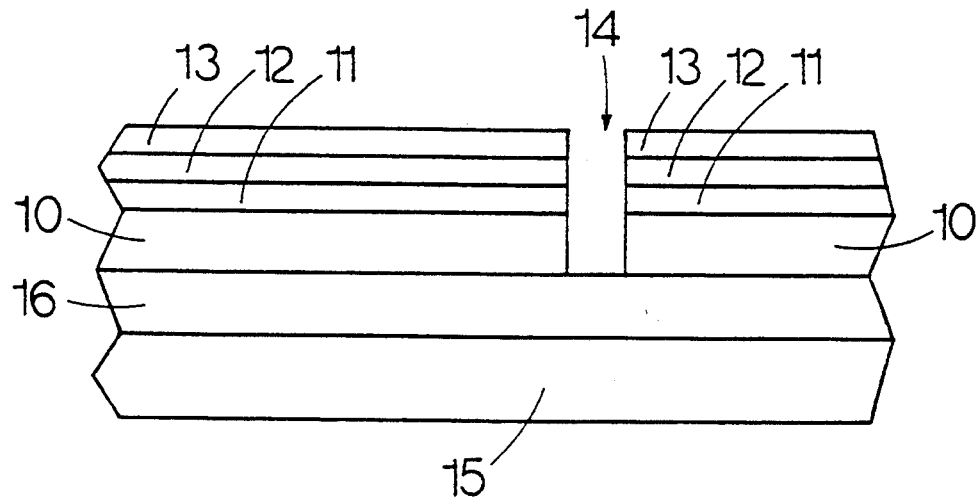

FIG. 1C shows the result of laminating the divided metal foil 10 to a polymeric backing sheet 15 by using an adhesive layer 16. The plurality of semiconductor device strips will be fixed in their relative separation from each other, by separating space 14, by means of the adhesive layer 16 on the polymeric backing sheet 15. Nip rollers with appropriate pressure and temperature can fix the position of the plurality of semiconductor device strips on the adhesive layer 16 on the polymeric backing sheet 15. Polymeric backing sheet 15 can be polyimide or polyester polymer material. Suitable pressure sensitive adhesives can be silicone- or acrylic-based adhesive materials.

Figure 1D:
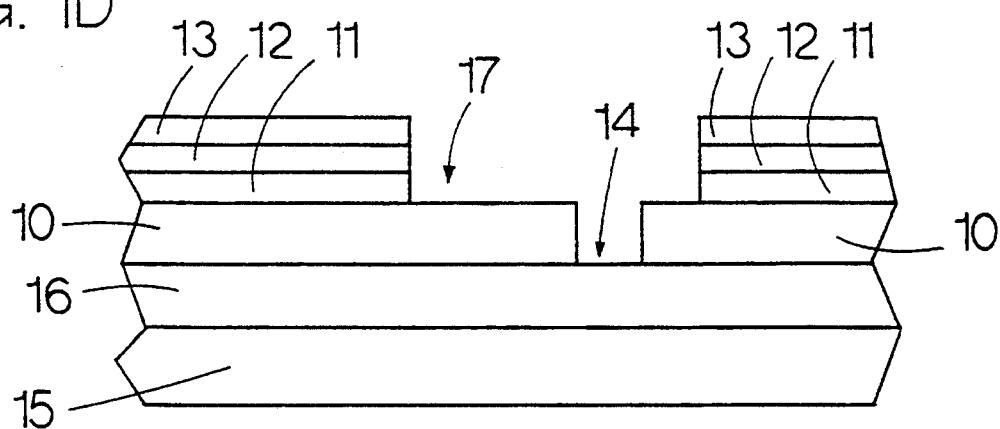

FIG. 1D shows the creation of an opening 17 in the transparent conducting contact layer 13, the semiconductor layer 12 and metal ohmic contact layer 11. Actually, ohmic metal contact layer 11 need not be removed, since the opening 17 is to expose conducting metal surfaces in the regions on either side of the separating space 14, for later ohmic contact to a conducting ink material. Only if the conducting ink material, to be discussed later, does not make good ohmic contact to the metal foil, 10, is it necessary to retain ohmic metal contact layer 11. The opening 17 is shown dividing layers 13, 12 and 11, which would be done in several places in the elongated layered structure shown in FIG. 1D, to the right and left of that shown there, the opening running perpendicular to the plane of the view in FIG. 1D. Opening 17 can be formed by using a water-jet etch moving along the material, or by a screen-printed etch paste. Such an opening 17 might extend 50 to 100 mils in width.

Figure 1E:
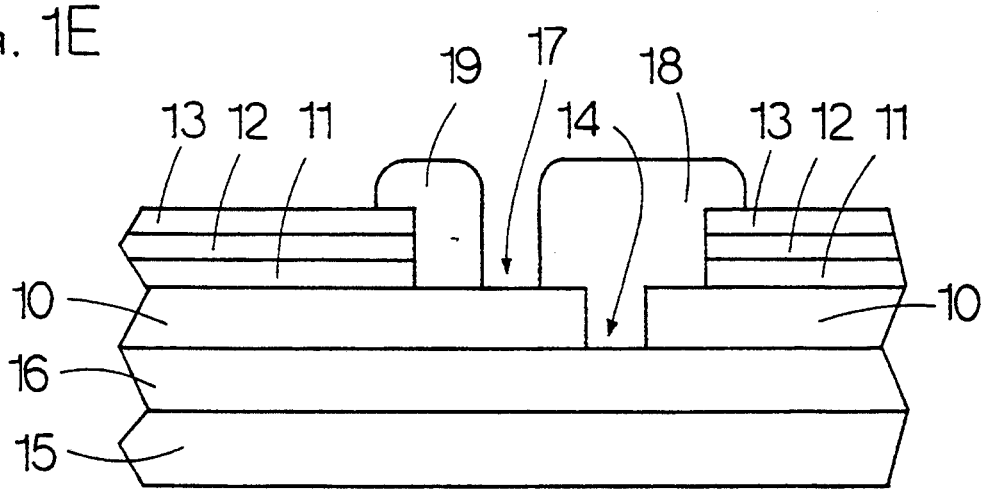

Thereafter, through the use of screen or ink-jet printing an electrically insulating polymer "ink" is applied to fill separating space 14 and to cover a portion of the upper major surface of transparent conducting top contact 13 near and on either side of space 14 in FIG. 1E. This polymer ink material forms an intervening electrical insulating material, 18, in space 14 which serves to further electrically isolate adjacent solar cell semiconductor devices from one another. A suitable polymer for this purpose which can be printed in this manner is Dexter Hysol Series epoxy polymer. Simultaneously, or alternatively, either before or after, additional polymer material, 19, in FIG. 1E is printed in space 17 at a location spaced apart from intervening material 18, and covering also a portion of the other upper major surface of transparent contact 13 to form a flow blocking layer 19. The same polymer material used for intervening material 18 is suitable for polymer 19. Polymers 18 and 19 are both printed as a strip perpendicular to the plane of the view shown in FIG. 1E and more or less parallel to one another. The width of these strips on the upper major surface of the transparent conducting contact 13 and over portions of the space 17 is approximately 20 mils but may be less. The width of strip 18 is usually wider than that of strip 19, as shown in FIG. 1E, but may be the same width.

Figure 1F:
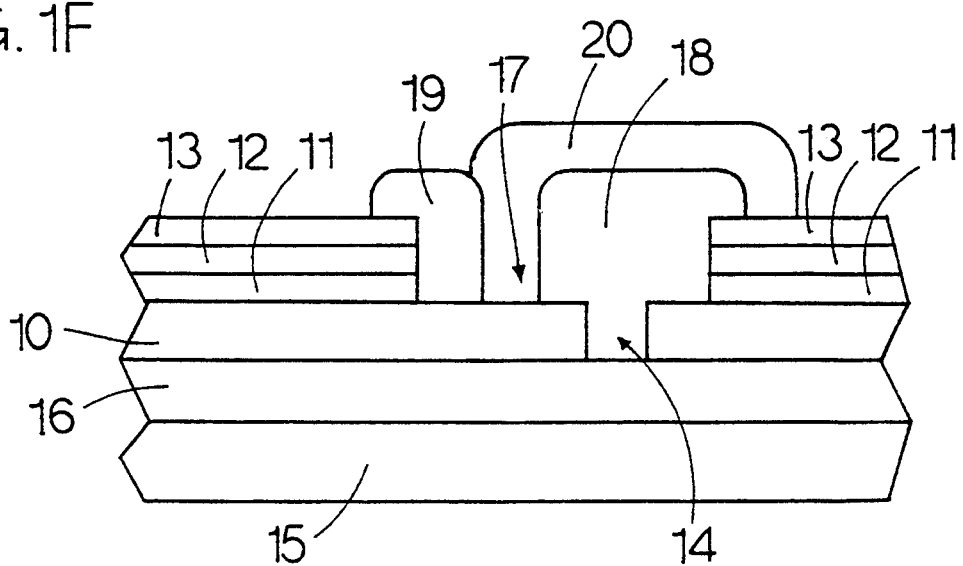

Between intervening material 18 and flow blocking material 19, and covering over intervening material 18, there is next printed, again by screen or ink-jet printing methods, a silver filled polymer ink strip, 20. Thus, the extent of strip 20 on the upper major surface of the transparent conducting contact 13 and over portions of the space 17 is limited by the presence of strip 19, as shown in FIG. 1F permitting convenient screen printing thereof in rapid, large volume fabrication operations. A suitable material for silver filled polymer ink 20 is Dupont 5007 Series inks. As mentioned in the discussion for FIG. 1D, silver filled polymer ink 20 is used to establish ohmic contact to the metal foil 10. Also, because the silver filled polymer ink 20 extends over the intervening material 18, the silver filled polymer 20 establishes ohmic contact to the upper major surface of the transparent conducting top contact, 13, of the adjacent cell. The final result is shown in FIG. 1F where the right-hand portion of transparent conducting contact 13 of the adjacent cell on the right side of gap 17 is in electrical contact with metal foil 10, by means of the silver filled polymer ink 20 extending onto intervening material 18 across the separating space 14 in which material 18 has been placed. Flow blocking material 19 helps prevent the cell from electrically shorting its bottom and top ohmic contact layers 11 and 13, respectively, by means of silver filled polymer ink 20 not being contained on the left-hand side of gap 17.

Figure 1G:
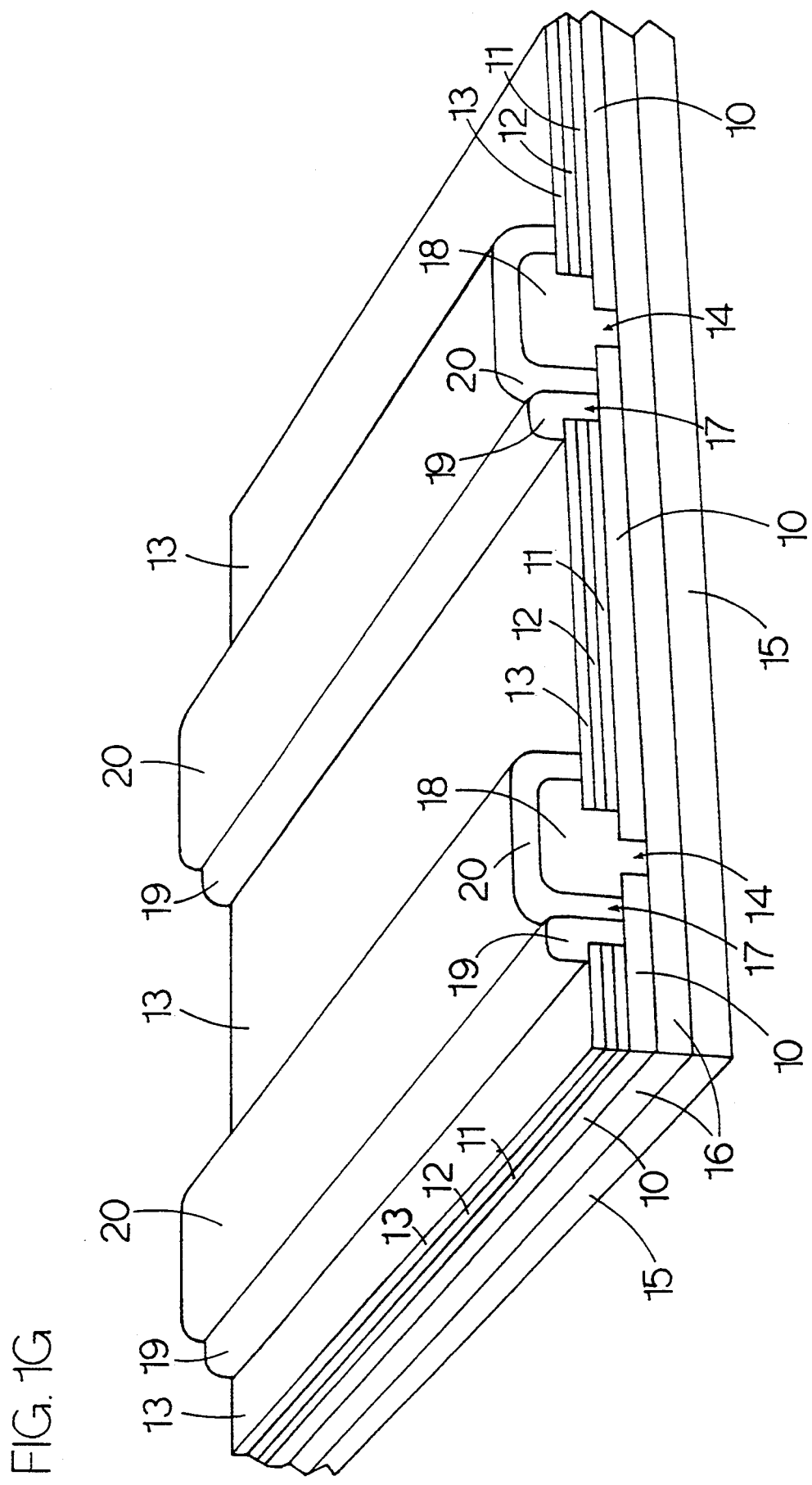

Another view of the resulting device of FIG. 1F is shown in FIG. 1G. The arrangement for electrical interconnection by means of silver filled polymer ink 20 is more clearly shown in extending from the metal foil 10 in one solar cell semiconductor device over intervening material 18 and on to the upper major surface of the transparent conducting contact material 13 in the adjacent solar cell semiconductor device.

Figure 2A:
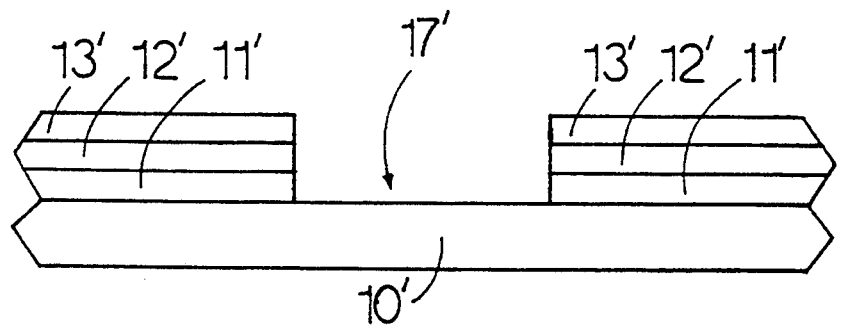
FIGS. 2A through 2C show a second embodiment of the present invention.

An alternate set of steps for the process of FIGS. 1B through 1D is shown beginning in FIG. 2A, a set which begins after the step shown in FIG. 1A. In these alternate steps, the results of which are shown in FIG. 2A through FIG. 2C, the creation of the gap in the transparent conducting contact layer, the semiconductor layer, and the metal ohmic contact layer precedes the metal foil slitting step and the step whereby the slit metal foil is laminated to the adhesive coated polymer backing sheet.

Thus, in FIG. 2A, opening 17' is created in the transparent conducting contact layer 13', the semiconductor layer 12' and ohmic metal contact layer 11'. The opening 17' is shown dividing layers 13', 12' and 11', which would be done in several places in the elongated layered structure shown in FIG. 2A to the right and left of that shown there, the opening running perpendicular to the plane of the view in FIG. 2A. Opening 17' can be formed by using a water-jet etch moving along the material, or by a screen-printed etch paste. Such an opening 17' might extend 50 to 100 mils in width.

Figure 2B:
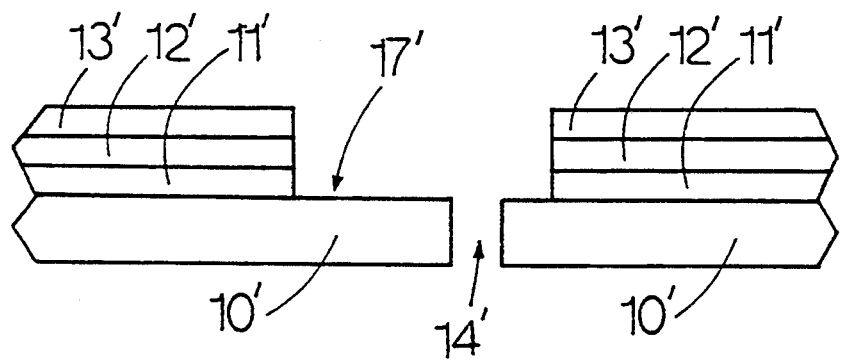

FIG. 2B shows the results of dividing metal foil 10', into a plurality of strips parallel to the web length, each of which will form a solar cell semiconductor device. The use of a web slitter or saw with spreader rollers provides a satisfactory method for leaving a separating space, 14', between each of the foil strip portions, of approximately 10 mil in width. The layered structure shown in FIG. 2B is formed as an elongated arrangement to the right and left of what is shown so that a plurality of separating spaces 14' to the right and left of the one shown and perpendicular to the plane of the paper are also formed. These spaces lead to a plurality of solar cell semiconductor devices being formed. The dividing may be continuous or may be interrupted in web regions that are between module segments.

Figure 2C:
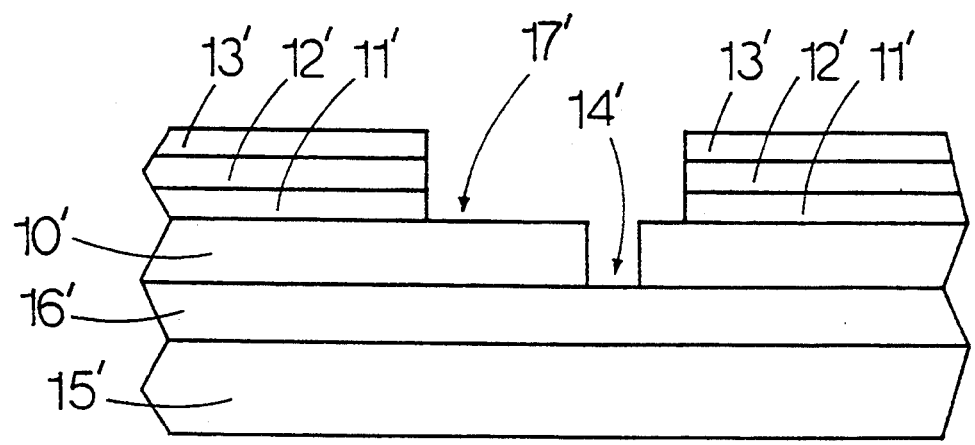

FIG. 2C shows the result of laminating the divided metal foil 10' to a polymeric backing sheet 15' by using an adhesive layer 15'. The plurality of semiconductor device strips will be fixed in their relative separation from each other, by separating space 14', by means of the adhesive layer 16' on the polymeric backing sheet 15'. Note that FIG. 2C is identical in the results shown originally in FIG. 1D.

Figure 3A:
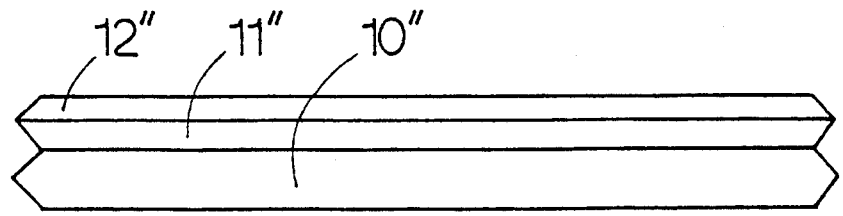
FIGS. 3A through 3F show a third embodiment of the present invention.

An alternate set of steps for the process of FIGS. 1A through 1D is shown beginning in FIG. 3A. In these alternate steps, the results of which are shown in FIG. 3A through FIG. 3F, insulating polymer "ink" strips are printed on the semiconductor layer prior to deposition of the transparent conducting contact layer. An opening is then created through the transparent conducting top contact layer, a portion of the underlying polymeric ink strip (or strips, if evenly spaced narrower, double, parallel strips are used rather than a single strip), and the metal ohmic contact layer, but stopping at the metal foil surface. As in the preceding alternate series of steps, the creation of openings precedes the metal foil slitting step and the step whereby the slit metal foil is laminated to the adhesive coated polymer backing sheet.

Thus, in FIG. 3A, formed on metal foil substrate 10" is metal ohmic contact layer 11". Layer 11" in turn supports a semiconductor material layer, 12", at its lower major surface. A transparent conducting contact layer is not deposited at this time.

Figure 3B:
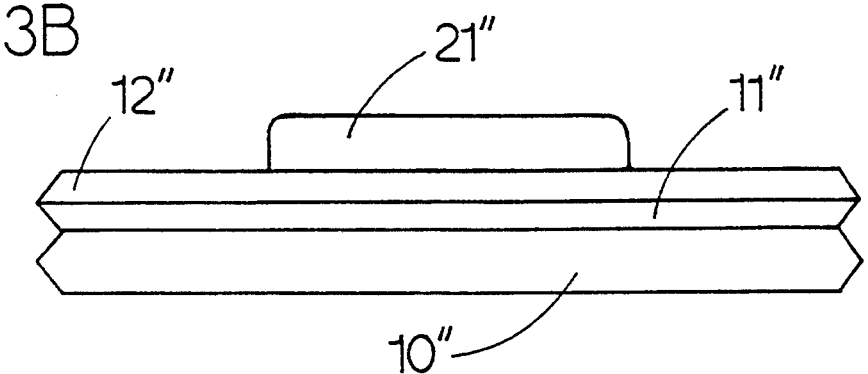

FIG. 3B shows the results of screen or ink-jet printing an electrically insulating polymer "ink", 21", on a portion of the upper major surface of the semiconductor layer, 12". This polymer ink material, 21", forms an intervening electrical insulating material over the upper surface of the semiconductor layer, 12". This polymer 21" is printed as a strip perpendicular to the plane of the view shown in FIG. 3B. The width of the polymer strip 21" is approximately 100 to 150 mils. Another alternative to the process shown in FIG. 3B would be to print not a single polymer strip 21" approximately 100 to 150 mils wide, but to print double, parallel polymer strips with a gap between them where the semiconductor layer 12" would not be covered by polymer material 21". The total width of one strip plus the gap plus the other strip width is 100 to 150 mils wide, the same as a single polymer strip, 21". A print of two narrower, parallel polymer strips could be done to use less polymer ink than in a single polymer strip as 21". The two narrower, parallel polymer strips could be printed simultaneously or each individually to create the gap between them.

Figure 3C:
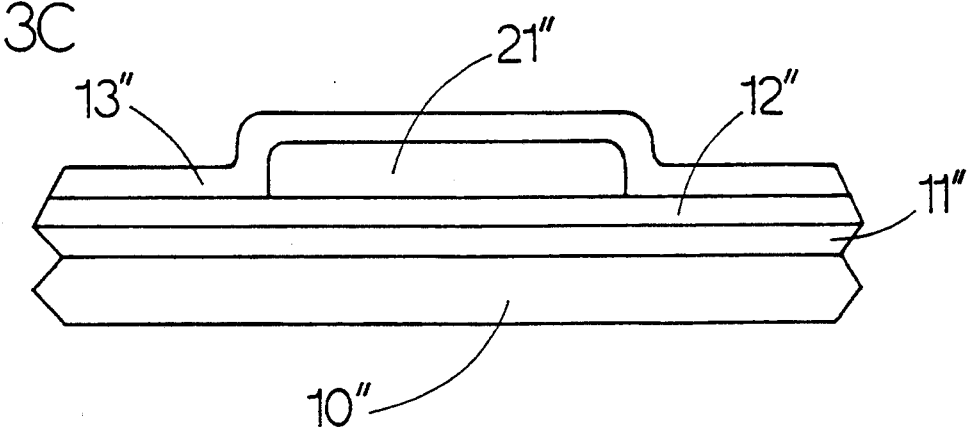

FIG. 3C shows a transparent conducting contact material layer 13" deposited over the semiconductor layer 12" and over the polymer material strip 21" printed on a portion of the semiconductor layer 12".

Figure 3D:
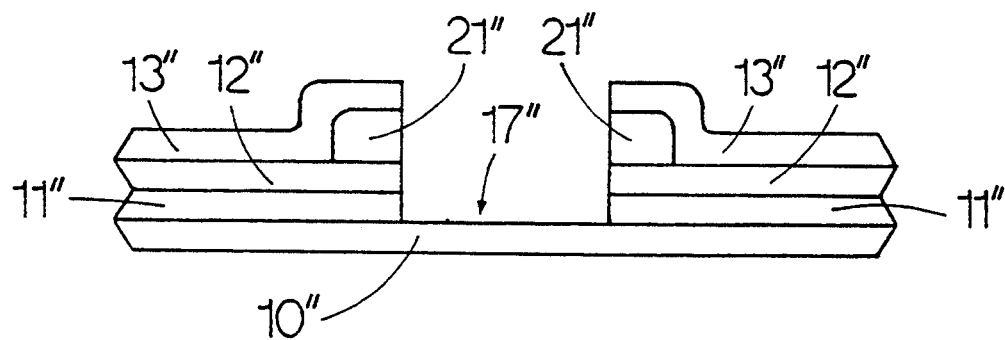

FIG. 3D shows the creation of an opening, 17", in the transparent conducting contact layer 13", the polymer material strip 21", the semiconductor layer 12", and the metal ohmic contact layer 11". Opening 17" can be formed by using a water-jet etch moving along the material, or by mechanical abrasion such as by a thin wire-wheel. A hard material such as stainless steel used in metal foil 10" will be relatively unaffected by an abrasive wheel capable of removing thin layers of transparent conducting material 13", semiconductor material layer 12" and metal ohmic contact layer 11", as well as the layer of relatively soft polymer material 21". The presence of polymer layer 21" prevents the transparent conducting contact layer 13" from electrically contacting the metal foil 10" when opening 17" is created by mechanical abrasion. The use of a single polymer strip 21" as discussed in the preceding explanation for FIG. 3C would allow even cutting through the various layers to achieve the result shown in FIG. 3D and thereby cause even abrasion of the metal foil 10". For this reason, a single polymer strip 21" is preferred over two, narrower, parallel polymer strips, despite the drawbacks that more polymer material is used when printing a single polymer strip and that more dust is created when the strip is mechanically abraded to create the opening 17".

Figure 3E:
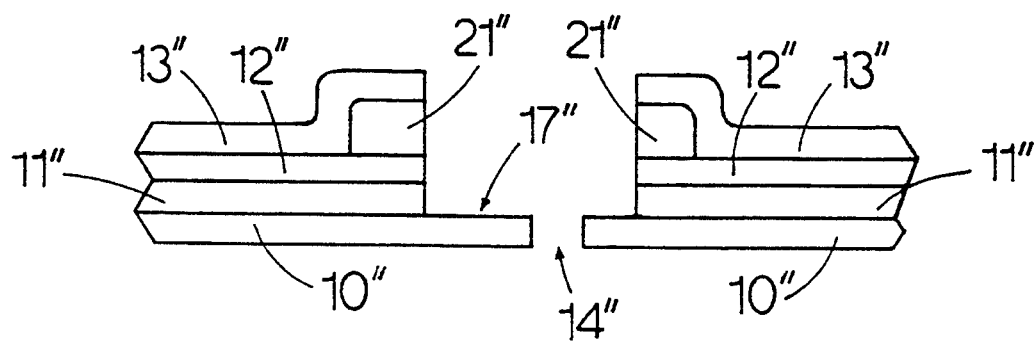

FIG. 3E shows the result of dividing metal foil 10" into a plurality of strips parallel to the web length, each of which will form a solar cell semiconductor device. The use of a web slitter or saw with spreader rollers provides a satisfactory method for leaving a separating space, 14", between each of the foil strip portions of approximately 10 mil in width. The layered structure shown in FIG. 3E is formed as an elongated arrangement to the right and left of what is shown so that a plurality of separating spaces 14" to the right and left of the one shown and perpendicular to the plane of the paper are also formed. These spaces lead to a plurality of solar cell semiconductor devices being formed. The dividing may be continuous or may be interrupted in web regions that are between module segments.

Figure 3F:
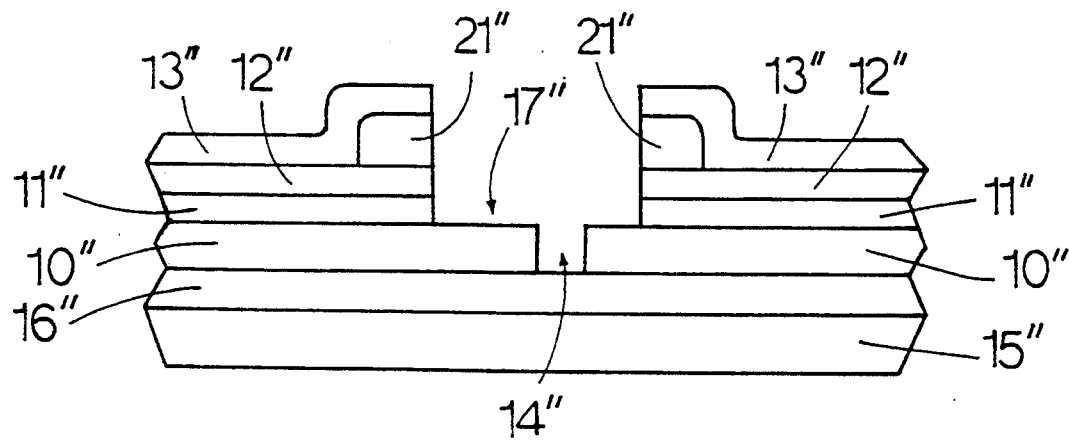

FIG. 3F shows the result of laminating the divided metal foil 10" to a polymer backing sheet 15" by using an adhesive layer 16". The plurality of semiconductor device strips will be fixed in their relative separation from each other, by separating space 14", by means of the adhesive layer 16" on the polymeric backing sheet 15". Note that FIG. 3F is identical in the results shown originally in FIG. 1D, except for the remainder of polymeric material layer 21" left after creating the opening 17" as shown in FIG. 3F. Subsequent steps in the present invention would apply, as shown in FIGS. 1E through 1G. The only modification in FIGS. 1E through 1G, would be the inclusion of the remainders of polymer material layer 21" (as it appears in FIG. 3F) on both sides of opening 17 in FIGS. 1E through 1G. The presence of the remainders of polymer layer 21" on both sides of opening 17 in FIGS. 1E through 1G would not affect in any way the results of the steps shown in FIGS. 1E through 1G. Hence, separate drawings showing the presence of the remainders of polymer layer 21" on both sides of opening 17 in Figures identical to FIGS. 1E through 1G except for the presence of the remainders is unnecessary, and they are omitted for brevity.

Figure 4:
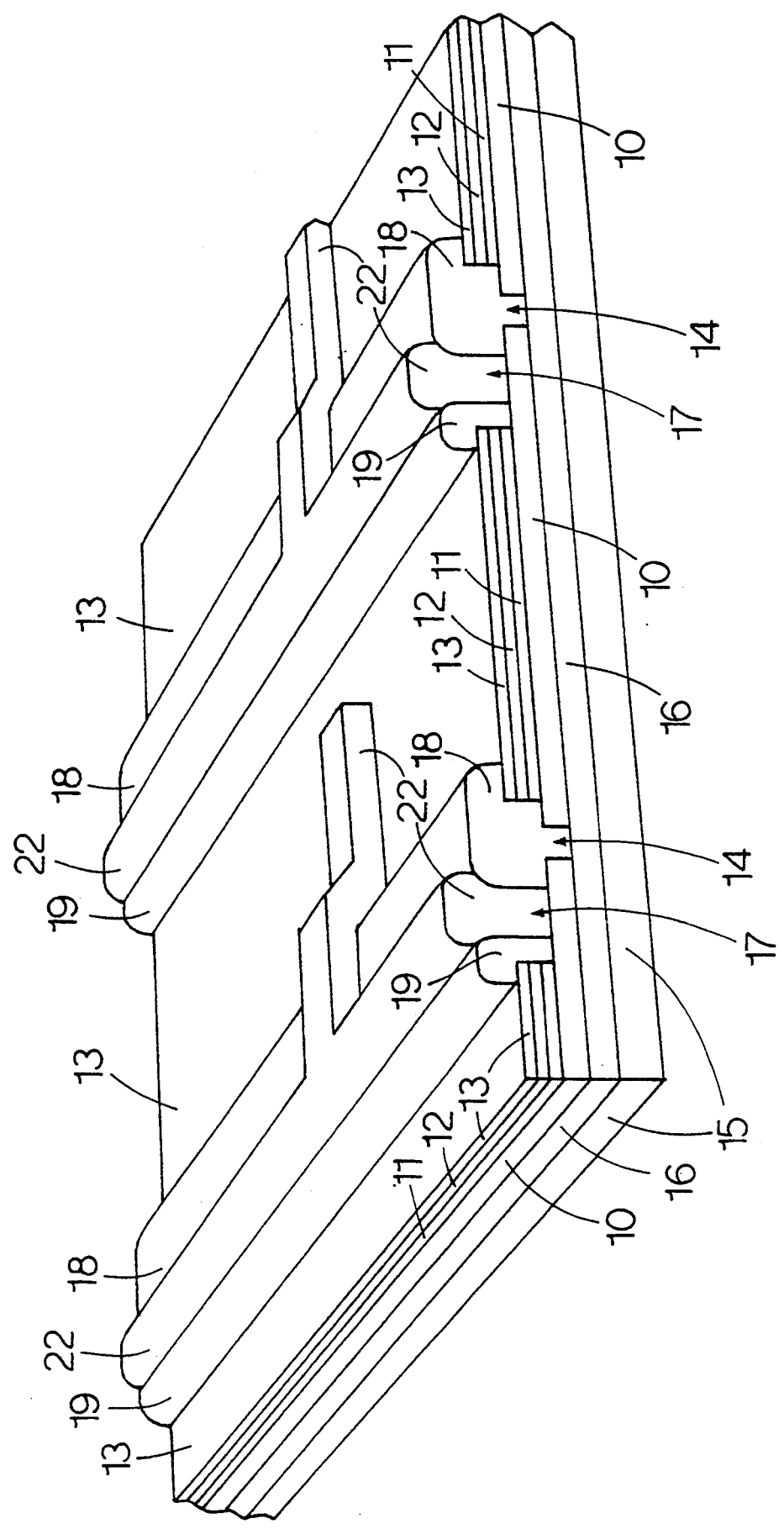
FIG. 4 shows a fourth embodiment of the present invention.

A modification of the resulting device shown in FIG. 1G is illustrated in FIG. 4. In FIG. 4, silver filled polymer 22 is printed between intervening material 18 and flow blocking material 19 with strips or fingers of the silver filled polymer 22 extending over the intervening material 18 and making contact with the transparent conducting contact 13. The silver filled polymer fingers, a plurality of which form a grid of conducting lines across the cell, perpendicular to the separating space 14, end before touching the flow blocking material 19 of the adjacent cell. The arrangement of polymer material 20 in FIG. 1G is replaced by the arrangement of polymer material 22 in FIG. 4. Another alternative to the silver polymer material arrangement shown in FIG. 4 and FIG. 1G would be to use the arrangement as shown for the silver polymer material 20 in FIG. 1G but add grid fingers extending over the transparent conducting material 13 as shown for silver polymer material 22 in FIG. 4. The arrangement for electrical interconnection by means of silver filled polymer ink 22 with grid fingers is clearly shown in FIG. 4 in extending from the metal foil 10 in one solar cell semiconductor device over the intervening material by means of silver filled polymer fingers, a plurality of which form a grid perpendicular to space 14, on to the upper major surface of the transparent conducting contact material 13 in the adjacent solar cell semiconductor device. Said silver filled polymer grid fingers of material 22 end before flow blocking material 19 of the adjacent cell, and the spacing of grid fingers in a direction parallel to space 14 is approximately equal to the distance between spaces 14 in two adjacent cells.

Figure 5A:
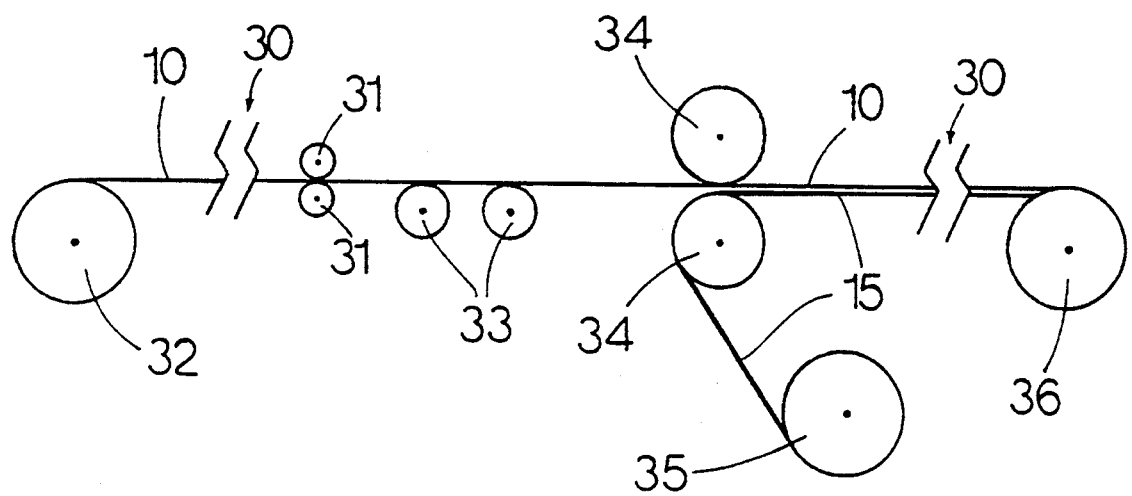
FIG. 5A and FIG. 5B show, respectively, the side and top views of machinery used for slitting and laminating steps in the process of the present invention.
Figure 5B:
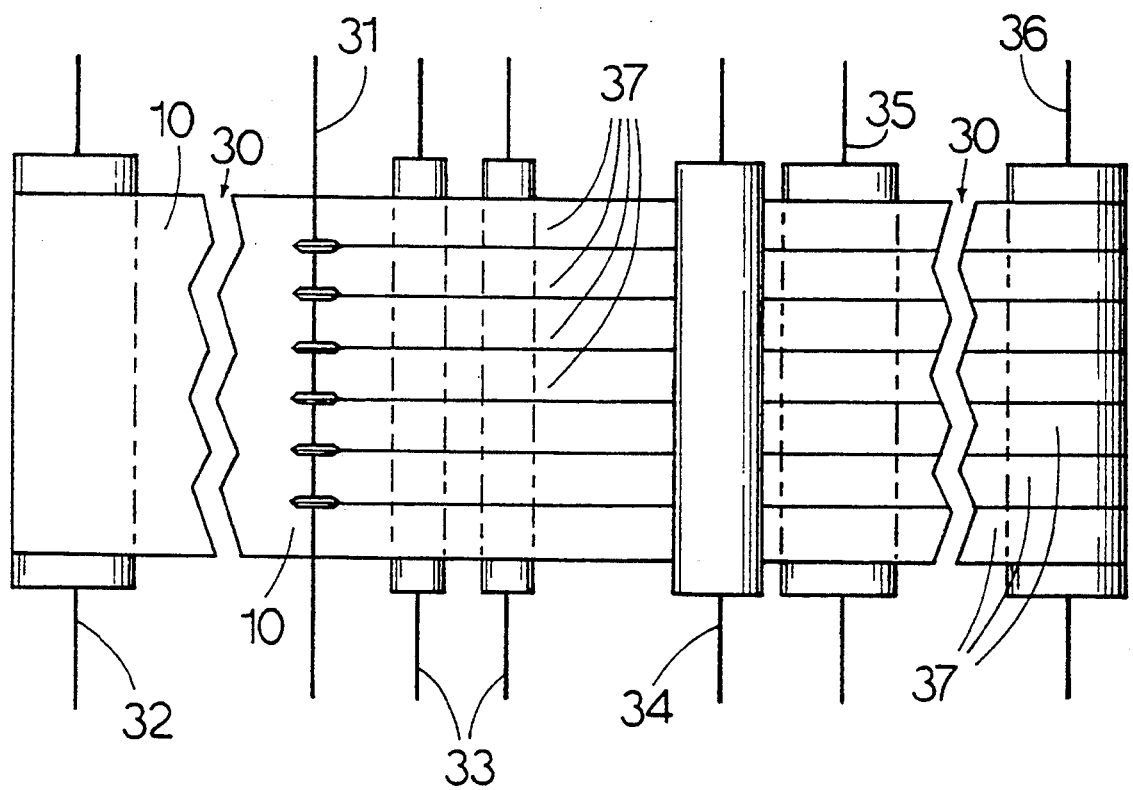

FIGS. 5A and FIG. 5B show, respectively, the side and top views of machinery used for the slitting and laminating steps in the described processes for fabricating the device of the present invention. The previous embodiments discussed all have in common these slitting and laminating steps, although some process steps occur before and/or after the slitting and laminating operations discussed in the various alternative methods. The breaks in the (coated) metal foil 10 indicated in FIGS. 5A and 5B by the zig-zag lines 30 indicate those parts of the process occurring before and/or after the slitting and laminating process.

The (coated) foil 10 in FIGS. 5A and 5B is supplied from a feed roll (with axle), 32. As mentioned, zig-zag lines 30 indicate process steps not shown in this illustration. A series of saws or slitters (with axles), 31, arranged across the width of the (coated) metal substrate foil 10 divides the foil into a plurality of strips, 37, each of which will form a solar cell semiconductor device, as the foil unwinds from the foil feeder roll 32. The number of strips 37, generally of equal width, is not limited to the number shown, but is arbitrary depending on the width of the foil 10 and the width of the cell strips 37 desired and/or possible. The dividing may be continuous or may be interrupted in the regions that are between module segments. A series of one or more spreader rollers, 33, is used to create a separating space between the strips 37 (the space designated as item 14 in the discussions of FIG. 1B) and to realign the strips 37 so that they run parallel with space 14 between each strip. As the strips 37 slit from foil 10 enter between nip rollers (with axles) 34, simultaneously, the polymer backing film 15 (with adhesive, as detailed in the discussion under FIG. 1C) is fed from polymer film feed roll (with axle) 35 into the nip rollers as well. The adhesive (item 16 under the FIG. 1C discussion) makes contact in the nip rollers with the uncoated (here shown as bottom) side of foil strips 37. Take up roll (with axle), 36, winds up the foil strips laminated to a polymer film backing for further processing into finished modules.

By the described machinery in FIGS. 5A and 5B one web-wide foil sheet is transformed into a number of narrow, parallel metal strip solar cells, to be later wound up on the foil take up roll. To avoid sawing debris, slitters made of block knives are the preferred manner of dividing the metal foil 10 (and layers 11, 12, 13 discussed in FIGS. 1A and 1B) into a plurality of solar-cell strips in a roll-to-roll process.

Although the present invention has been described with reference to preferred embodiments, workers skilled in the art will recognize that changes may be made in form and detail without departing from the spirit and scope of the invention.

What is claimed is:

1. A method for fabricating an interconnected array of semiconductor devices based on an electrically conductive substrate initially having on a surface thereof a conductive support layer which supports a semiconductor material layer thereon having first and second major surfaces with said support layer being in electrical contact with said semiconductor material layer second major surface, and said semiconductor material layer also having initially therewith a conductive interconnection layer on said semiconductor material layer first major surface, said method comprising:

dividing said conductive interconnection layer, and said semiconductor material layer, and said support layer and said electrically conductive substrate into a plurality of semiconductor devices by separating into portions said electrically conductive substrate together with said conductive interconnection layer, said semiconductor material layer and said support layer, to thereby form separating spaces between adjacent said semiconductor devices each of which devices comprises a corresponding portion of said electrically conductive substrate and a corresponding portion of said support layer and a corresponding portion of said semiconductor material layer having corresponding portions of said first and second major surfaces, and a corresponding portion of said conductive interconnection layer;

forming at divided-and-separated said electrically conductive substrate second major surface portions a lamination to an electrically insulating material film by means of an adhesive material layer whose said second major surface adheres to the first major surface of said insulating material film, and whose said first major surface adheres rigidly to the second major surface portions of said divided-and-separated said electrically conductive substrate portions, said separating spaces between adjacent said semiconductor devices being maintained by said adhesive material layer, which layer having been sandwiched between said divided-and-separated said semiconductor devices and said insulating material film;

forming between each pair of adjacent said semiconductor devices an opening in said interconnection material layers and said semiconductor material layers and said support layers, by removing selected commonly located portions of said interconnection material layers and said semiconductor material layers and said support layers, said opening being on both sides of said separating spaces between each pair of adjacent said semiconductor devices, said devices having been laminated to said adhesive material layer and to said insulating material film, with said separating space distance maintained;

forming at each said opening between each pair of said semiconductor devices an electrically insulating intervening material in each said separating space extending through said electrically conductive substrate to said adhesive material layer, said insulating intervening material covering in said opening the exposed thickness and first major surface portions of the said electrically conductive substrate and the exposed thicknesses of said support layer and of said semiconductor material layer of said adjacent said semiconductor device, and said forming of said intervening material is accompanied by forming, simultaneously or alternatively, an electrically insulating flow blocking material, at said opening opposite from said adjacent said semiconductor device, covering the exposed thicknesses of said semiconductor material layer and the exposed thickness and a portion of the upper major surface of said interconnection layer of said semiconductor device, but leaving a portion of the upper major surface of said electrically conductive substrate of said semiconductor device, between said intervening material and said flow blocking material, uncovered by either said intervening material or said flow blocking material; and forming at each said opening a metal further comprising material in each said uncovered portion of said electrically conductive substrate, between said intervening material and said flow blocking material, said metal comprising material making electrical contact with said electrically conductive substrate, and covering over said intervening material to make electrical contact with the first major surface of said interconnection layer of said adjacent said semiconductor device.

2. A method for fabricating an interconnected array of semiconductor devices based on an electrically conductive substrate initially having on a surface thereof a conductive support layer which supports a semiconductor material layer thereon having first and second major surfaces with said support layer being in electrical contact with said semiconductor material layer second major surface, and said semiconductor material layer also having initially therewith a conductive interconnection layer on said semiconductor material layer first major surface, said method comprising:

- forming a plurality of openings in said interconnection layers and said semiconductor material layers and said support layers, by removing selected commonly located portions of said interconnection layers and said semiconductor material layers and said support layers, thereby exposing a plurality of portions of said electrically conductive substrate;

- dividing said electrically conductive substrate into a plurality of semiconductor devices by separating into strip portions said electrically conductive substrate, in the regions of exposed said openings, to thereby form separating spaces between adjacent said semiconductor devices, each of which devices further comprises a portion of said electrically conductive substrate, including that portion whose upper major surface is exposed in said opening, and a portion of said support layer and a corresponding portion of said semiconductor material layer having corresponding portions of said first and second major surfaces, and a corresponding portion of said conductive interconnection layer;

- forming at said electrically conductive substrate second major surface portions a lamination to an electrically insulating material film by means of an adhesive material layer whose second major surface adheres rigidly to the first major surface of said electrically insulating material film, and whose first major surface adheres rigidly to the second major surface portions of said electrically conductive substrate portions, said separating spaces between adjacent said semiconductor devices being maintained rigidly by said adhesive material layer, said layer having been sandwiched between said semiconductor devices and said insulating material film;

- forming at each said opening between each pair of said semiconductor devices on electrically insulating intervening material in each said separating space extending through said electrically conductive substrate to said adhesive material layer, said insulating intervening material covering in said opening an exposed thickness and first major surface portions of said electrically conductive substrate and the exposed thicknesses of said support layer and of said semiconductor material layer of adjacent said semiconductor device, and said forming of said electrically insulating intervening material is accompanied by forming, simultaneously or alternatively, an electrically insulating flow blocking material, at said opening opposite from said adjacent said semiconductor device, covering the exposed thicknesses of said semiconductor material layer and the exposed thickness and a portion of the upper major surface of said interconnection layer of said semiconductor device, but leaving a portion of the upper major surface of said electrically conductive substrate of said semiconductor device, between said intervening material and said electrically insulating flow blocking material, uncovered by either said intervening material or said electrically insulating flow blocking material; and

- forming at each said opening a metal comprising material in each uncovered portion of said electrically conductive substrate, between said intervening material and said electrically insulating flow blocking material, said metal comprising material making electrical contact with said electrically conductive substrate, and covering over said intervening material to make electrical contact with the first major surface of said interconnection layer of said adjacent said semiconductor device.

3. A method for fabricating an interconnected array of semiconductor devices based on an electrically conductive substrate initially having on a surface thereof a conductive support layer which supports a semiconductor material layer thereon having first and second major surfaces with said support layer being in electrical contact with said semiconductor material layer second major surface, said method comprising:

- forming a plurality of deposits of an electrically insulating protective material on said first major surface of said semiconductor material layer;

- forming an electrically conductive interconnection layer on said semiconductor material layer first major surface, and over said protective material covering portions of said semiconductor material layer;

- forming a plurality of openings in said interconnection layer, by removing selected commonly located portions of said interconnection layer, and said protective material and said semiconductor material layer and said support layer, stopping at said first major surface of said electrically conductive substrate, but leaving a portion of said protective material on both sides of each said opening so formed;

- dividing said electrically conductive substrate into a plurality of semiconductor devices by separating into strip portions said electrically conductive substrate, in exposed regions of said openings, to thereby form separating spaces between adjacent said semiconductor devices, each of said plurality of semiconductor devices comprises a portion of said electrically conductive substrate, including that portion whose upper major surface is exposed in said opening, and a portion of said conductive support layer and a corresponding portion of said semiconductor material layer having corresponding portions of said first and second major surfaces, and a corresponding portion of said conductive interconnection layer;

- forming at said electrically conductive substrate second major surface portions a lamination to an electrically insulating material film by means of an adhesive material layer which adheres rigidly to the first major surface of said insulating material film and to the second major surface portions of said electrically conductive substrate portions, said separating spaces between said adjacent said semiconductor devices being maintained rigidly by said adhesive material layer, which layer having been sandwiched between said semiconductor devices and said insulating material film;

- forming at each said opening between each pair of said semiconductor devices an electrically insulating intervening material in each said separating space extending through said electrically conductive substrate to said adhesive material layer, said electrically insulating intervening material covering in said opening an exposed thickness and first major surface portions of said electrically conductive substrate and the exposed thickness of said support layer and of said semiconductor material layer of said adjacent said semiconductor device, and said forming of said electrically insulating intervening material is accompanied by forming, simultaneously or alternatively, an electrically insulating flow blocking material, at said opening opposite from said adjacent said semiconductor device, covering the exposed thicknesses of said semiconductor material layer and of said protective material, and the exposed thickness of and a portion of a surface of said interconnection layer of said semiconductor device, but leaving a portion of a surface of said electrically conductive substrate of said semiconductor device, between said intervening material and said flow blocking material uncovered by either said intervening material or said electrically insulating flow blocking material; and forming at each said opening a metal comprising material in each said uncovered portion of said electrically conductive substrate, between said electrically insulating intervening material and said electrically insulating flow blocking material, said metal comprising material making electrical contact with said electrically conductive substrate, and covering over said electrically insulating intervening material to make electrical contact with the first major surface of said interconnection layer of said adjacent said semiconductor device.

4. The method of claim 1 wherein said dividing of said electrically conductive substrate is interrupted in regions between module segment lengths.

5. The method of claim 2 wherein said dividing of said electrically conductive substrate is interrupted in regions between module segment lengths.

6. The method of claim 3 wherein said dividing of said electrically conductive substrate is interrupted in regions between module segment lengths.

7. The method of claim 1 wherein said conductive support layer is not removed in forming said opening in said materials.

8. The method of claim 2 wherein said conductive support layer is not removed in forming said opening in said materials.

9. The method of claim 3 wherein said conductive support layer is not removed in forming said opening in said materials.

10. The method of claim 1 wherein use of said conductive support layer is eliminated entirely.

11. The method of claim 2 wherein use of said conductive support layer is eliminated entirely.

12. The method of claim 3 wherein use of said conductive support layer is eliminated entirely.

13. The method of claim 1 wherein said metal comprising material covers over said intervening material to make electrical contact with the first major surface of said interconnection layer of said adjacent said semiconductor device, and said metal comprising material covers over said intervening material also or only by means of a plurality of approximately parallel strips, approximately perpendicular to said separating space and contacting and extending onto the first major surface of said interconnection layer of said adjacent said semiconductor device.

14. The method of claim 2 wherein said metal comprising material covers over said intervening material to make electrical contact with the first major surface of said interconnection layer of said adjacent said semiconductor device, and said metal comprising material covers over said intervening material also or only by means of a plurality of approximately parallel strips, approximately perpendicular to said separating space and contacting and extending onto the first major surface of said interconnection layer of said adjacent said semiconductor device.

15. The method of claim 3 wherein said metal comprising material covers over said intervening material to make electrical contact with the first major surface of said interconnection layer of said adjacent said semiconductor device, and said metal comprising material covers over said intervening material also or only by means of a plurality of approximately parallel strips, approximately perpendicular to said separating space and contacting and extending onto the first major surface of said interconnection layer of said adjacent said semiconductor device.

16. The method of claim 3 wherein said interconnection layer is not formed over said protective material.

17. The method of claim 3 wherein said protective material is deposited, simultaneously or alternatively, in two or more separate portions.

18. The method of claim 1 for fabricating an array of semiconductor devices, wherein the methods of forming said separating spaces in said electrically conductive substrate and of forming said lamination of said plurality of said semiconductor devices to said electrically insulating material film by means of forming said adhesive material layer to the second major surface of said electrically conductive substrate and to the first major surface of said electrically insulating film, are used, said instant method comprising:

providing a flexible, electrically conducting metal foil substrate in roll form, wherein web handling methods are used to process said metal foil substrate in web roll form;

cutting said metal foil substrate, unwound from a feed roll and later rewound onto a take-up roll, into a plurality of metal foil substrate strips, each of which will become a said semiconductor device;

spreading said metal foil substrate strips to create said separating space between the strips, appropriately shaped web rollers forming said separating spaces after said cutting of said metal foil substrate in said web form;

laminating said spaced metal foil substrate strips in web form to an insulating polymer film in web form, by means of said adhesive layer on said polymer film first surface, said spaced metal foil substrate strips and said adhesive-coated polymer film, being web-fed together into a roll-to-roll web laminating system with an appropriate pressure and temperature to cure said adhesive layer laminating said metal foil web strips to said polymer film web;

tensioning said web in the said web cutting, said web spreading and said web lamination processes by means of a web take-up roll which applies tension force along the continuous web as it unwinds from said feed roll and changes from web to continuous said metal foil substrate strips and eventually to said metal foil substrate strips laminated to said adhesive coated polymer film, becoming a metal foil strip/polymer film laminated composite, wherein it is eventually rolled up by said take-up roll.

19. The method of claim 2 for fabricating an array of semiconductor devices, wherein the methods of forming said separating spaces in said electrically conductive substrate and of forming said lamination of said plurality of said semiconductor devices to said electrically insulating material film by means of forming said adhesive material layer to the second major surface of said electrically conductive substrate and to the first major surface of said electrically insulating film, are used, said instant method comprising:

provide a flexible, electrically conducting metal foil substrate in roll form, wherein web handling methods are used to process said metal foil substrate in web roll form;

cutting said metal foil substrate, unwound from a feed roll and later rewound onto a take-up roll, into a plurality of metal foil substrate strips, each of which will become a said semiconductor device;

spreading said metal foil substrate strips to create said separating space between the strips, appropriately shaped web rollers forming said separating spaces after said cutting of said metal foil substrate in said web form;

laminating said spaced metal foil substrate strips in web form to an insulating polymer film in web form, by means of said adhesive layer on said polymer film first surface, said spaced metal foil substrate strips and said adhesive-coated polymer film, being web-fed together into a roll-to-roll web laminating system with an appropriate pressure and temperature to cure said adhesive layer laminating said metal foil web strips to said polymer film web;

tensioning said web in the said web cutting, said web spreading and said web lamination processes by means of a web take-up roll which applies tension force along the continuous web as it unwinds from said feed roll and changes from web to continuous said metal foil substrate strips and eventually to said metal foil substrate strips laminated to said adhesive coated polymer film, becoming a metal foil strip/polymer film laminated composite, wherein it is eventually rolled up by said take-up roll.

20. The method of claim 3 for fabricating an array of semiconductor devices, wherein the methods of forming said separating spaces in said electrically conductive substrate and of forming said lamination of said plurality of said semiconductor devices to said electrically insulating material film by means of forming said adhesive material layer to the second major surface of said electrically conductive substrate and to the first major surface of said electrically insulating film, are used, said instant method comprising:

providing a flexible, electrically conducting metal foil substrate in roll form, wherein web handling methods are used to process said metal foil substrate in web roll form;

cutting said metal foil substrate, unwound from a feed roll and later rewound onto a take-up roll, into a plurality of metal foil substrate strips, each of which will become a said semiconductor device;

spreading said metal foil substrate strips to create said separating space between the strips, appropriately shaped web rollers forming said separating spaces after said cutting of said metal foil substrate in said web form;

laminating said spaced metal foil substrate strips in web form to an insulating polymer film in web form, by means of said adhesive layer on said polymer film first surface, said spaced metal foil substrate strips and said adhesive-coated polymer film, being web-fed together into a roll-to-roll web laminating system with an appropriate pressure and temperature to cure said adhesive layer laminating said metal foil web strips to said polymer film web;

tensioning said web in the said web cutting, said web spreading and said web lamination processes by means of a web take-up roll which applies tension force along the continuous web as it unwinds from said feed roll and changes from web to continuous said metal foil substrate strips and eventually to said metal foil substrate strips laminated to said adhesive coated polymer film, becoming a metal foil strip/polymer film laminated composite, wherein it is eventually rolled up by said take-up roll.

* * * * *